(12) United States Patent
Sydorenko et al.

(10) Patent No.: US 8,164,087 B2
(45) Date of Patent: Apr. 24, 2012

(54) ORGANIC SEMICONDUCTOR COMPOSITIONS WITH NANOPARTICLES

(75) Inventors: Oleksandr Sydorenko, Painted Post, NJ (US); Subramanian Vaidyanathan, Piscataway, NJ (US)

(73) Assignee: Alcatel Lucent, Paris (FR)

( * ) Notice: Subject to any disclaimer, the term of this patent is extended or adjusted under 35 U.S.C. 154(b) by 448 days.

(21) Appl. No.: 11/423,555

(22) Filed: Jun. 12, 2006

(65) Prior Publication Data
US 2007/0284570 A1    Dec. 13, 2007

(51) Int. Cl.
H01L 29/08    (2006.01)
H01L 35/24    (2006.01)
H01L 51/00    (2006.01)

(52) U.S. Cl. ............ 257/40; 257/E51.001; 257/E51.024; 257/E21.046

(58) Field of Classification Search .................... 257/40, 257/E51.003, E51.025, E51.046; 977/936, 977/938, 811
See application file for complete search history.

(56) References Cited

U.S. PATENT DOCUMENTS

| | | | |
|---|---|---|---|
| 6,602,671 B1 * | 8/2003 | Bawendi et al. ............. 435/7.1 |
| 6,689,468 B2 * | 2/2004 | Edelmann et al. ............ 428/403 |
| 6,777,706 B1 * | 8/2004 | Tessler et al. ................. 257/17 |
| 6,797,412 B1 | 9/2004 | Jain et al. | |
| 7,019,327 B2 * | 3/2006 | Lee et al. ........................ 257/40 |
| 7,057,206 B2 | 6/2006 | Halik et al. | |
| 7,081,210 B2 * | 7/2006 | Hirai et al. ............... 252/62.3 Q |
| 7,081,234 B1 * | 7/2006 | Qi et al. ...................... 423/592.1 |
| 7,615,775 B2 | 11/2009 | Wada et al. | |
| 2003/0175004 A1 * | 9/2003 | Garito et al. ................. 385/143 |
| 2004/0038459 A1 | 2/2004 | Brown et al. | |
| 2005/0002635 A1 | 1/2005 | Banin et al. | |
| 2005/0006656 A1 | 1/2005 | Jain et al. | |
| 2005/0056828 A1 * | 3/2005 | Wada et al. .................... 257/40 |
| 2005/0095448 A1 | 5/2005 | Katz et al. | |
| 2005/0104060 A1 * | 5/2005 | Halik et al. .................... 257/40 |
| 2006/0060839 A1 | 3/2006 | Chandross et al. | |
| 2006/0076050 A1 | 4/2006 | Williams et al. | |
| 2007/0114516 A1 * | 5/2007 | Napierala ....................... 257/40 |

FOREIGN PATENT DOCUMENTS

| | | |
|---|---|---|
| CN | 1646613 A | 7/2005 |
| CN | 1650445 A | 8/2005 |
| WO | 02/45184 A1 | 6/2002 |
| WO | 03070816 A1 | 8/2003 |
| WO | WO03089515 * | 10/2003 |
| WO | WO2006026070 | 3/2006 |

OTHER PUBLICATIONS

Tianhong Cui, Guirong Liang, Jingshi Shi, Fabrication of Pentacene Organic FIeld-Effect Transistors Containing SiO2 Nanoparticle hin Film as the Gate Dielectric, 2003, IEEE, 0/7803-7872-5/03, pp. IEDM 03-207-03-210.*

R.A. Street; "Transport in Polycrystalline Polymer Thin-Film Transistors"; 2005 The American Physical Society, Physical Review B 71, 165202 (2005); pp. 165202-1-165202-13.

(Continued)

*Primary Examiner* — Lynne Gurley
*Assistant Examiner* — Jesse Y Miyoshi
(74) *Attorney, Agent, or Firm* — Hitt Gaines, PC

(57) ABSTRACT

A composition, comprising a medium of organic molecules, a plurality of nanoparticles dispersed in the medium, and a coating chemically bonded to a surface of the nanoparticles, wherein the composition is a semiconducting solid.

20 Claims, 7 Drawing Sheets

OTHER PUBLICATIONS

N.C. Greenham, et al., "Charge Separation and Transport in Conjugated-Polymer/Semiconductor-Nanocrystal Composites Studied by Photoluminescence Quenching and Photoconductivity" Physical Review B, vol. 54, No. 24, Dec. 15, 1996, pp. 17628-17637.

Related case—Chinese Office Action for Application No. 200780021685.6 dated Nov. 20, 2009; 3 pages.

"Titanium Dioxide"; From Wikipedia, the free encyclopedia, http://en.wikipedia.org/w/index.php?title_Titanium_dioxide&printable, Jul. 28, 2011, 10 pages.

"Band Gap", From Wikipedia, the free encyclopedia, http://en.wikipedia.org/wiki/Band-gap, Jul. 28, 2011, 5 pages.

"Titanium Dioxide", http://www.oxmat.co.uk/Crysdata/tio2.htm; Jul. 28, 2011, 8 pages.

\* cited by examiner

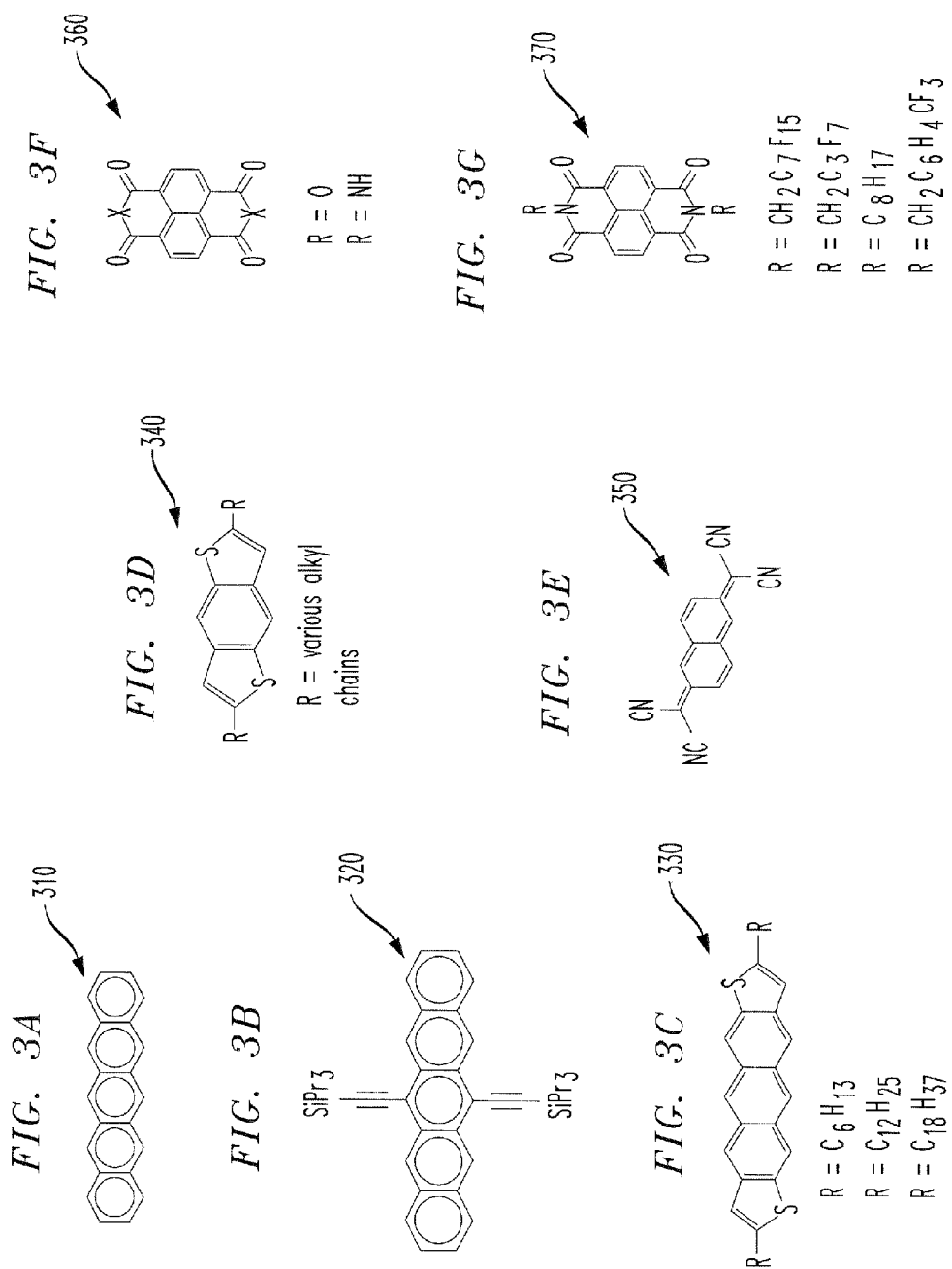

US 8,164,087 B2

ORGANIC SEMICONDUCTOR COMPOSITIONS WITH NANOPARTICLES

TECHNICAL FIELD OF THE INVENTION

The present invention is directed, in general, to organic semiconductors and, more particularly, to organic semiconductor compositions suitable for use in organic field-effect transistors (oFETs).

BACKGROUND OF THE INVENTION

Organic semiconductors are the subject of intense research because of their potential for low-cost, flexible electronic devices. They have been employed in organic light-emitting diodes (oLEDs) and organic field-effect transistors (oFETs), and in circuits integrating multiple devices. Fabrication techniques such as ink-jet printing have helped reduce the cost of fabrication of these devices and integrated circuits using them.

Devices built on organic semiconductors typically often have a carrier mobility that is relatively low compared to that of semiconductors such as silicon. Such devices also often have a relatively low ratio of on-current to off-current ($I_{on}/I_{off}$) compared to that of devices based on traditional semiconductors. An organic semiconducting material is needed that combines improved carrier mobility and improved $I_{on}/I_{off}$.

SUMMARY OF THE INVENTION

To address one or more of the above-discussed deficiencies, one embodiment is a composition. The composition comprises a medium of organic molecules and a plurality of nanoparticles dispersed in the medium. A coating is chemically bonded to a surface of the plurality of nanoparticles. The composition is a semiconducting solid.

Another embodiment is a method of fabricating a circuit. The method comprises chemically bonding a coating to a plurality of nanoparticles. The nanoparticles are dispersed in a medium including organic molecules, and an organic semiconductor channel is formed thereof. A plurality of electrodes is formed over the substrate. The electrodes are located to function as two of a gate electrode, a drain electrode, and a source electrode of an FET.

Another embodiment is an apparatus. The apparatus comprises an electronic device having an organic semiconductor channel with first and second electrodes in contact with the channel. The channel comprises a medium of organic molecules and a plurality of nanoparticles dispersed in the medium. The nanoparticles have a coating chemically bonded to a surface thereof.

BRIEF DESCRIPTION OF THE DRAWINGS

Various embodiments are understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which:

FIGS. 3A through 3G illustrate examples of nonpolymer organic semiconducting molecules;

DETAILED DESCRIPTION

One embodiment is a semiconducting solid composition comprising a plurality of nanoparticles dispersed in a medium of organic molecules. The nanoparticles have a coating chemically bonded to a surface thereof. The coating will be discussed in detail below. The organic molecules may include polymers or nonpolymers. The majority charge carriers in the composition may be electrons or holes, depending on the nature of the molecules. If the majority carriers are electrons, the composition is n-type, and if the majority carriers are holes, the composition is p-type.

Figures 1A, 1B:
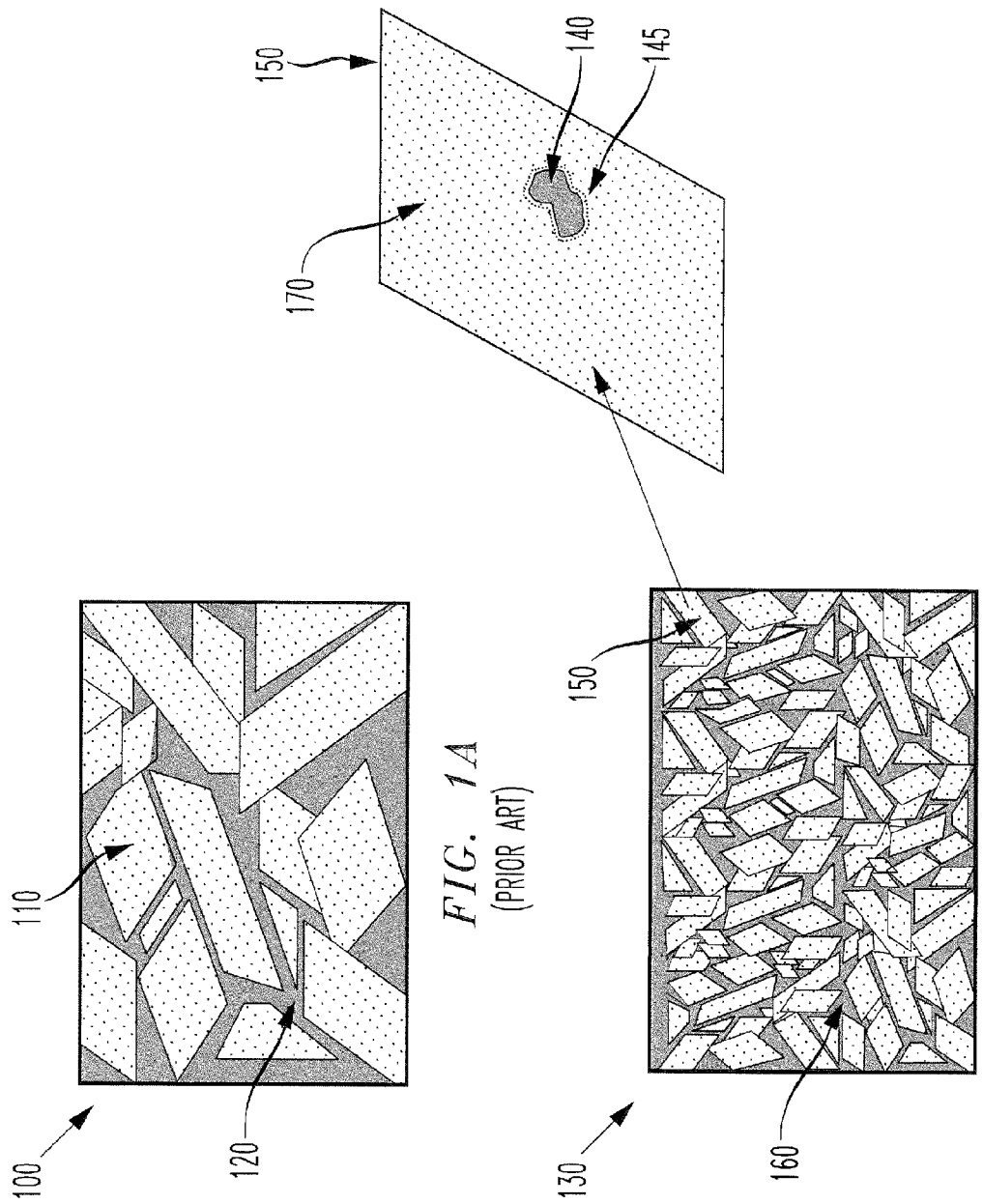
FIGS. 1A and 1B present plan views of a composition including organic molecules, without and with nanoparticles, respectively.
Figure 2E:
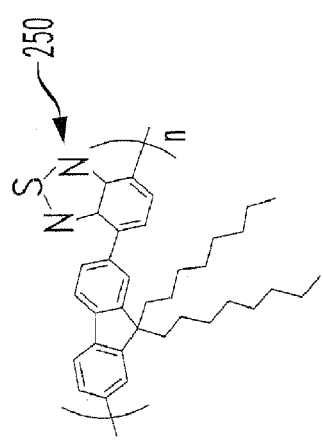
FIGS. 2A through 2E illustrate examples of semiconducting polymers.
Figure 2C:
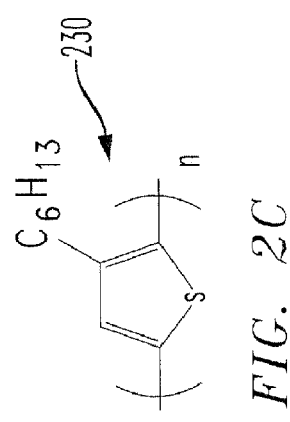
Figure 2D:
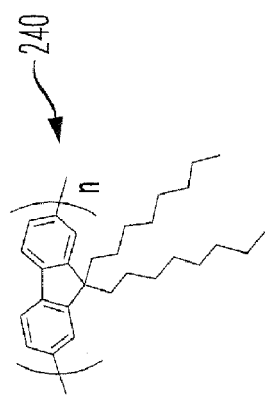
Figure 2A:
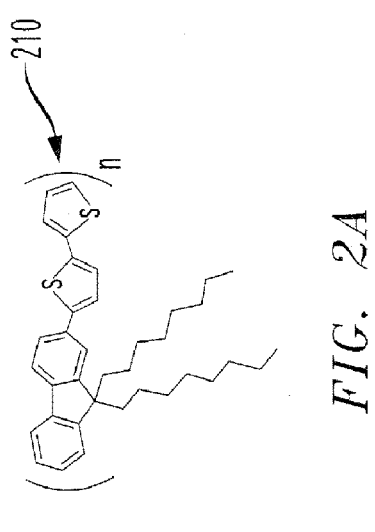
Figure 2B:
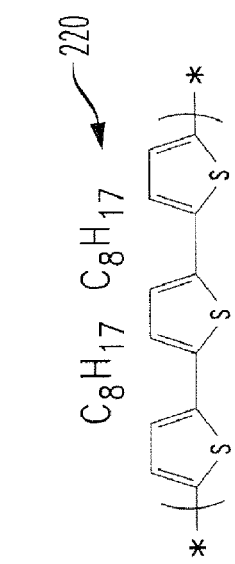

FIG. 1A shows a plan view of a conventional solid composition 100 including organic molecules. In the composition 100, the organic molecules form crystalline domains 110 and amorphous regions 120 between the crystalline domains 110. The crystalline domains 110 have a mean size. FIG. 1B shows a plan view of a composition 130 that includes a medium of organic molecules and nanoparticles 140. The nanoparticle 140 has a coating 145 chemically bonded to a surface thereof. In the composition 130, the organic molecules form crystalline domains 150 and amorphous regions 160 between the crystalline domains 150. However, the mean size of the crystalline domains 150 is smaller than that of the crystalline domains 110 in conventional composition 100. This aspect of composition 130 is addressed in greater detail below.

Each crystalline domain 150 may be isolated, or may be in contact with one or more neighboring crystalline domains 150. In general, however, 1) a crystalline domain 150 is characterized by having an arbitrary crystal orientation with respect to its neighboring crystalline domains 150, and 2) the amorphous regions 160 occupy the volume not occupied by crystalline domains 150.

The amorphous regions 160 are characterized by a substantial lack of long-range ordering associated with the individual crystalline domains 150. If the organic molecules include polymers, the amorphous regions 160 may include entire amorphous polymer chains, portions of chains included in the crystalline domains 150, or both. If the organic molecules include nonpolymers, the amorphous regions 160 may also include nonpolymer molecules.

FIG. 1B is understood to be a simplified representation of the morphology of a polycrystalline material. In a real material, the crystalline domains 150 will have a specific distribution of sizes. This distribution may have one or more modes, each mode representing a local maximum of a probability density function of the sizes of crystalline domains 150 in the composition 130. For simplicity in the following discussion, the probability distribution will be assumed to be a normal distribution, with the mode equal to the mean. However, the composition 130 is not limited to a size distribution of crystalline domains 150 having a single mode.

The mobility of the composition 130 may be a function of the mean size of the crystalline domains 150. The term "size" includes concepts such as average diameter, minimum diameter, mass, volume, and other accepted metrics for describing the size of a crystal domain. Other factors that may influence the carrier mobility of the composition 130 include the relative volume occupied by crystalline domains 150 and amorphous regions 160, and the distribution of orientations of the crystalline domains 150.

As was noted previously, the mean size of crystalline domains 150 in the composition 130 is less than the mean size of crystalline domains 110 in the conventional composition 100. The detailed view of the crystalline domain 150 in FIG. 1B shows that the crystalline domain 150 may also contain one or more nanoparticles 140 in addition to organic molecules 170.

In one aspect, the nanoparticles 140 are dispersed in the composition 130 in a manner such that the number density (number of particles per unit volume) of nanoparticles 140 is substantially uniform in the composition 130. In another aspect, the distribution of nanoparticles 140 is uniform on a scale on the order of the distance between electrodes fabricated on the composition 130. In another aspect, the distribution of nanoparticles 140 is uniform on a scale of about 10 μm or less. However, the nanoparticles 140 may be distributed such that there is a higher concentration of nanoparticles 140 in the crystalline domains 150 than in the amorphous regions 160.

The organic molecules may be polymers or a mixture of polymers and nonpolymers. A polymer fraction of the composition 130 may consist of one essentially pure polymeric compound, or may include two or more polymeric compounds. Similarly, a nonpolymer fraction, if present, in the composition 130 may consist of one essentially pure nonpolymer compound, or may include two or more nonpolymer compounds. Moreover, if the composition 130 includes more than one organic compound, the composition 130 may include crystalline domains 150 corresponding to more than one organic compound.

The organic molecules may be characterized by having semiconducting properties in the solid phase. Those skilled in the pertinent art will appreciate that organic semiconductors may be members of two broad classes. The first of these classes is polymers incorporating aromatic or heteroaromatic units, where the units may be fused to each other and/or linked to each other in a way that maintains conjugation. The second includes monodisperse compounds incorporating aromatic or heteroaromatic units, where the units may be fused to each other and/or linked to each other in a way that maintains conjugation. This second class also includes oligomeric chains that would otherwise fall into the first class if the number of repeat units were sufficiently large. As used herein, the term "polymer" conforms to the first class definition, and "nonpolymer" conforms to the second.

Numerous semiconducting polymers are known. Examples of aromatic units that may be included in these polymers include, without limitation, bithiophene, fluorene, and benzothiadiazole. Examples of substitutions on these types of polymers that may also have semiconducting properties include, without limitation, alkyl groups, alkoxy groups, ethers, and/or hydroxyl groups.

FIGS. 2A-2E show examples of such polymers. The examples include: poly(9,9-dioctylfluorene-alt-bithiophene (F8T2) 210; poly(3,3'-dioctylterthiophene) (PTT8) 220; regioregular poly(3-hexylthiophene) (P3HT) 230; poly(9,9-dioctylfluorene) (F8) 240; and poly(9,9-dioctylfluorene-alt-benzothiadiazole) (F8BT) 250. Those skilled in the pertinent art will appreciate that these polymers are members of the aforementioned class, and that these examples are not exhaustive of such class members.

Numerous examples of semiconducting nonpolymers are also known in the art. FIGS. 3A-3G show examples of such nonpolymers. These examples include: processable derivatives of pentacene 310, such as 6,13-bis(triisopropylsilyl-ethynyl)pentacene (TIPS) 320; processable derivatives of anthradithiophene 330 and benzodithiophene 340; tetracyanoquinodimethane 350, naphthalene-1,4,5,8-tetracarboxyl di-anhydride 360, and derivatives 370 of N-substituted naphthalene-1,4,5,8-tetracarboxylic di-imide. Those skilled in the chemical arts will appreciate that this set of example nonpolymers is not exhaustive.

In some embodiments, the composition 130 includes a polymer. In one such embodiment, the polymer is F8T2 210. The solid phase of F8T2 210 is generally a p-type semiconductor, with a typical effective hole mobility of about 1e–3 $cm^2 \cdot V^{-1} \cdot s^{-1}$.

The term "nanoparticle" describes a class of organic or inorganic particles with a dimension of about 100 nm or less. In some cases, the nanoparticles 140 have a dimension of about 20 nm or less. A nanoparticle may also be an aggregate of smaller particles loosely coupled by weak interactions such as van der Waals forces. A nanoparticle may be insulating, semiconducting, or conducting. If insulating, the nanoparticles 140 may include a material that has negligible conductivity. The material will have a negligible conductivity when the material has a band gap large enough that there is not significant conduction of carriers at a temperature and voltage potential experienced by the composition 130 under contemplated operating conditions.

In some cases, the nanoparticles 140 may include silicon. In other cases, the nanoparticles 140 may include silicon dioxide. In another aspect, the nanoparticles 140 may include a metal oxide, e.g., titanium dioxide or aluminum oxide. In another aspect, the nanoparticles may include conducting or semiconducting organic compounds such as fullerenes or nanorods. Methods of fabricating the preceding example materials are well-known to those of skill in the pertinent arts.

It is believed that in a p-type semiconducting molecule, e.g., effective mobility through the solid may be limited by "hopping" between π-orbitals of neighboring molecules. It is believed that the crystalline domains 150 are probably formed by closely packed chains, between which carriers may hop with relative ease. In contrast, amorphous regions are formed by loosely packed chains with relatively few chains overlapping in a manner favorable for hopping to occur. Thus, majority carriers in the crystalline domains 150 have a higher mobility than those in the amorphous regions 160.

It is thought that by inclusion of nanoparticles 140 in the composition 130, the size and orientation distributions of the crystalline domains 150 may be altered to result in a greater number of smaller crystalline domains 150. It is believed that such a morphology may produce improved mobility in the bulk composition 130 by providing a more isotropic distribution of current paths, and a greater number of current paths with higher conductivity.

The average size of the nanoparticles 140 is thought to play a role in producing the desired morphology. For example, the mean size of the nanoparticles 140 may be chosen to be suitable to nucleate crystal growth while occupying a negligible volume fraction of the composition 130. In one aspect, the mean size may be small enough to nucleate crystal growth without substantially disrupting the growth of the crystal. In some cases, the mean size may be similar to the radius of curvature of a polymer chain in a dispersion of the polymer and nanoparticles in a solvent. In an embodiment, the nanoparticles 140 have an average diameter about 15 nm or less. In another embodiment, the average diameter is about 12 nm. In some cases, the size distribution of the nanoparticles 140 may have more than one mode.

In an embodiment, the nanoparticles 140 may be fused silica, which can be manufactured with small particle size. In one embodiment, Aerosil® A200, a fused silica product manufactured by Degussa Corp., Parsippany, N.J., is used. Aerosil® A200 has an average particle surface area of about 200 m²/g, corresponding to a mean diameter of about 12 nm for individual particles.

Small particles such as nanoparticles 140 may have a tendency to form aggregates due to dipolar or van der Waals attraction. To improve dispersion of the nanoparticles 140 in the organic molecules, the coating 145 is chemically bonded to a surface of the nanoparticles 140. As used herein, a coating is one or more chemical groups attached to a surface of a nanoparticle 140. The coating may be continuous or noncontinuous, and does not necessarily isolate the nanoparticle from the surrounding environment. The coating 145 may include a chemical group defined herein as a "compatibility agent." The compatibility agent may reduce dipolar or van der Waals interactions between the nanoparticles 140 that could otherwise cause the aggregation of such nanoparticles 140. In some cases, the coating 145 may include more than one type of compatibility agent. In other cases, more than one type of compatibility agent may be used to create a mixture of nanoparticles 140 with different coatings 145 dispersed in the same composition 130.

In one aspect, the compatibility agent may be a nonpolar group, which may include an organic moiety. In some cases, the compatibility agent includes an aromatic ring. When present, the aromatic ring may further include a phenyl ring. An atom or group of atoms may be attached to the organic moiety to modify interaction of a nanoparticle 140 with the organic molecules. In one aspect, an attached atom, if present, may be a halogen. For example, as discussed below, when the organic molecules include the polymer F8T2 210, a phenyl ring to which bromine is attached is effective at reducing aggregation and producing desirable electrical characteristics of the composition 130.

Thus, it is apparent that the compatibility agent may serve two roles in the composition 130. The first is to reduce aggregation of the nanoparticles 140 prior to and after mixing with the organic molecules. The second is to provide favorable interaction with the organic molecules. Favorable interaction may include, e.g., better adhesion, desired nucleation properties, or specific electrical interaction resulting in decreased presence of charge-carrier traps.

Figure 4:
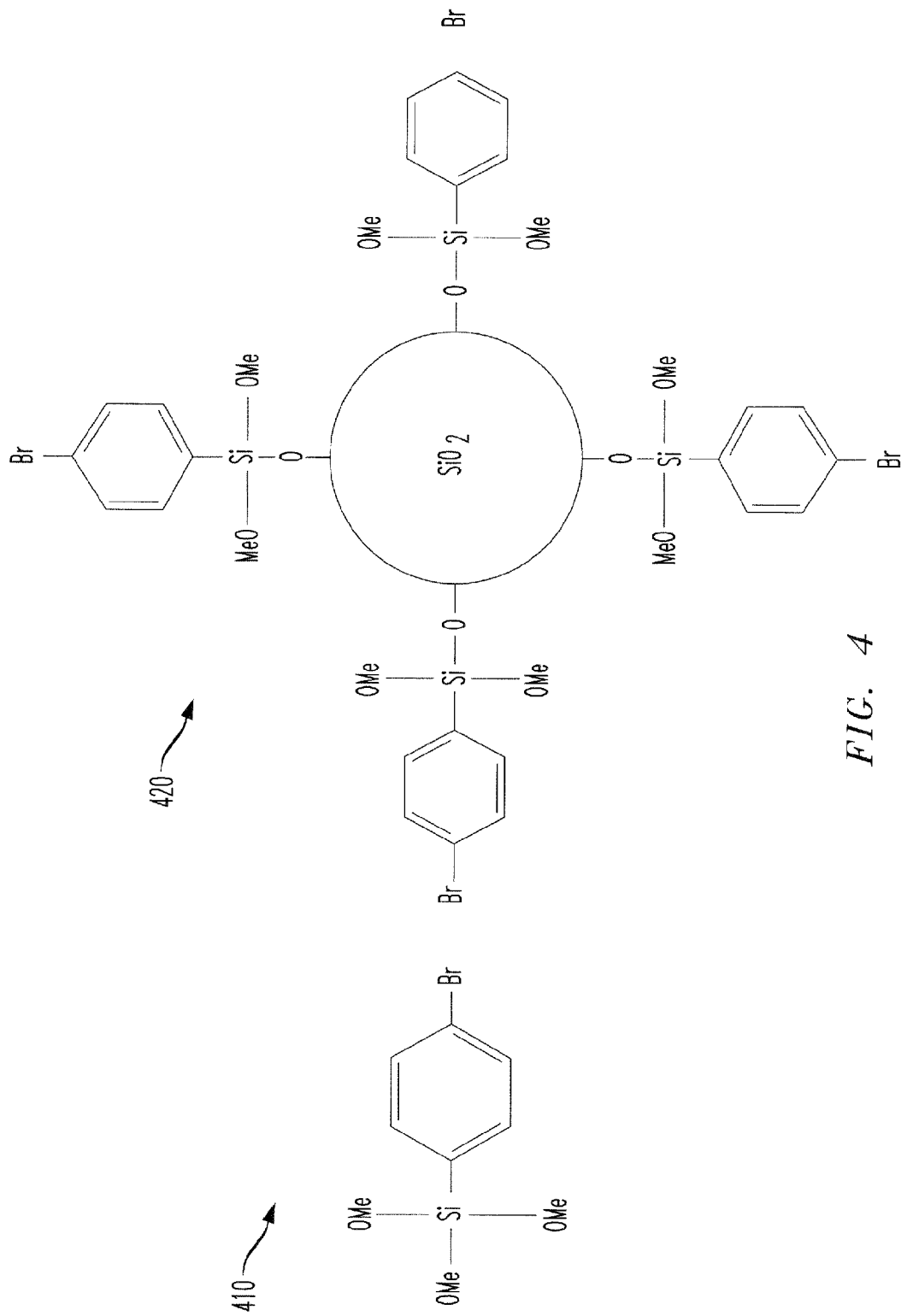
FIG. 4 illustrates a nanoparticle with an organic moiety attached to the surface.

Without limitation, FIG. 4 presents a conceptual view of an organic moiety suitable for modifying a silica nanoparticle. 4-bromophenyl trimethoxy silane (BP-TMS, CAS #17043-05-9) 410 is a bromine-substituted derivative of trimethoxy silane. It is believed that a methoxy group reacts with the silica particle, forming a covalent bond to attach the TMS 410 thereto, producing the coating 145 and resulting in the desired characteristics of the nanoparticles 420. It is further thought that the position of bromine atoms in this isomer results in desirable interaction with F8T2 210.

Another embodiment is a method of fabricating a circuit. The method includes chemically bonding a coating to a plurality of nanoparticles 140. The nanoparticles are dispersed between organic molecules and the resulting composition is used to form an organic semiconductor channel. Electrodes are formed over the substrate, and the electrodes may be located to function as a gate electrode, a drain electrode, and/or a source electrode of an FET. The active channel of the FET includes the semiconductor.

Figure 5:
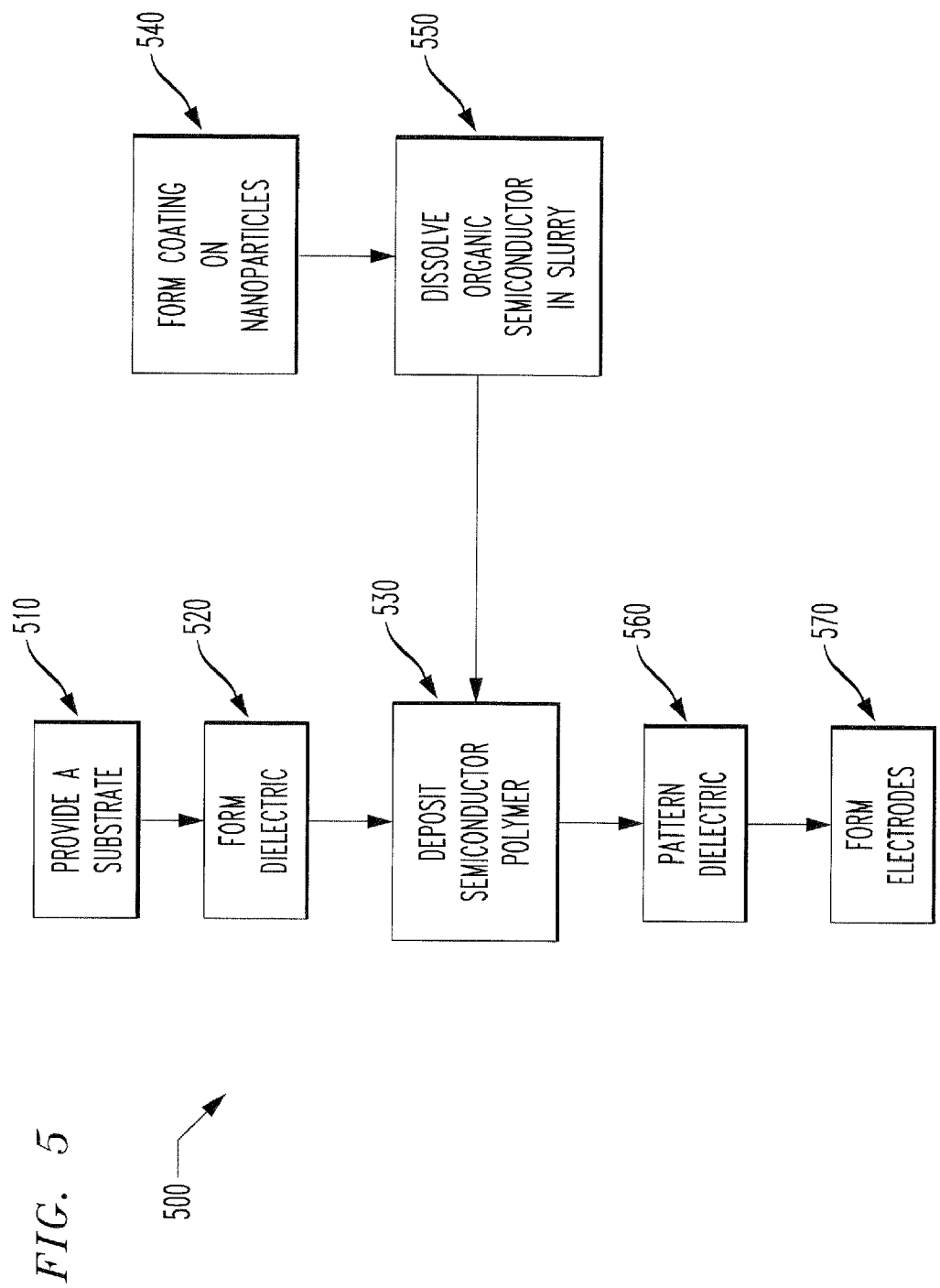
FIG. 5 illustrates a method of forming an oFET using the composition comprising organic molecules and nanoparticles.

FIG. 5 illustrates a method 500 of fabricating a circuit. Those skilled in the art will appreciate that several architectures may be used to form an oFET, including bottom gate, top gate, and coplanar structures. For illustration purposes, the method 500 will be presented assuming a bottom gate oFET. It will be immediately apparent to those skilled in the art that other oFET architectures may be employed.

Figure 6:
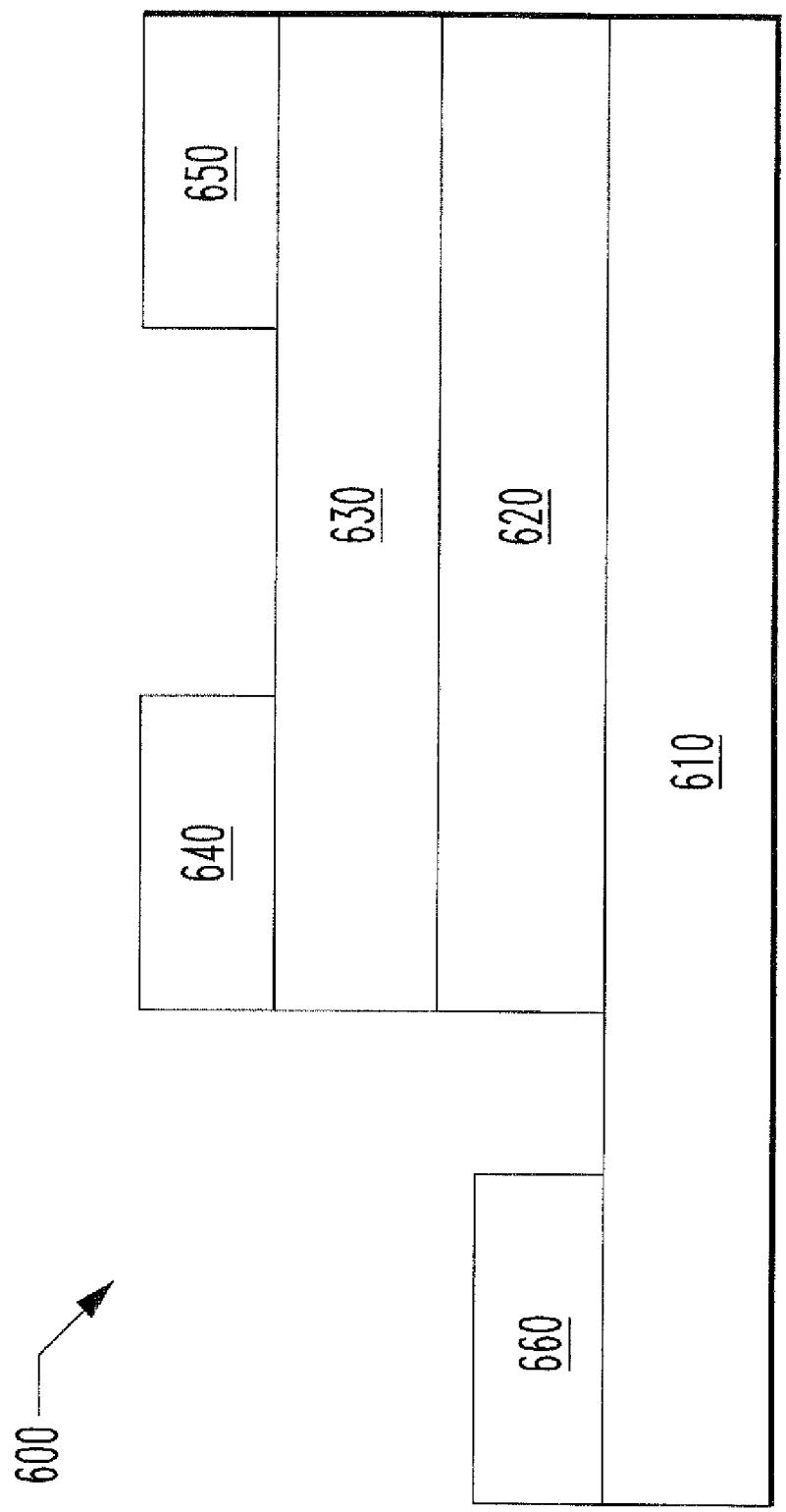
FIG. 6 is a sectional view of an oFET comprising the composition.

FIG. 6 illustrates a sectional view of a bottom-gate oFET 600. In the illustrated architecture, the bottom gate includes a substrate 610 having sufficient conductivity to act as a gate. A dielectric 620 insulates a channel layer 630 from the substrate 610. A source electrode 640, drain electrode 650 and gate electrode 660 provide electrical connectivity to the terminals of the oFET 600.

In FIG. 5, step 510, the substrate 610 is provided, upon which the circuit will be fabricated. The substrate 610 may be a $p^{++}$-silicon wafer or other suitable substrate. In a step 520, the dielectric 620 is conventionally formed over the substrate. The dielectric 620 may be a thermally grown $SiO_2$ layer, though those skilled in the art will understand that other conventional dielectrics may also be used.

In a step 530, the channel layer 630 is formed on the dielectric 620. The channel layer 630 may be, e.g., the composition 130, and may be deposited from a suspension of the nanoparticles 140 with the coating 145 in a solution of organic molecules by dip-coating, spin-coating or jet-spraying. In one embodiment, the channel layer 630 includes a polymer.

A multi-step process may be used to prepare the suspension for deposition on the substrate 610. While the steps in the following described embodiment are presented in a sequence, those skilled in the pertinent art will appreciate that the steps could be performed in other sequences. Any sequence using substantially similar steps that results in the described suspension is contemplated.

In a step 540, the coating 145 is formed on a plurality of nanoparticles. The step includes removing moisture from a quantity of nanoparticles 140 sufficient for the following steps. For example, about 1 g of nanoparticles 140 may be dried at about 120° C. for about 12 hours. After drying, the nanoparticles 140 are treated to produce the coating 145 to improve dispersion of the nanoparticles 140 in the channel layer 630. In one embodiment, the treatment reduces the aggregation of the nanoparticles 140. In some cases, the treatment modifies polar interactions between the nanoparticles 140 as previously described.

A suitable method of such treatment is described below for the case in which the nanoparticles 140 comprise silicon dioxide. The recitation of specific quantities and times is provided as example, without limitation. In one embodiment, the derivative is BP-TMS 410. A solution of about 1 g of BP-TMS in about 100 mL toluene may be mixed for about 30 min. About 1 g of dried nanoparticles 140 may be added to the BP-TMS/toluene solution, and the mixture may be stirred for about 12 hours in dry conditions. Ultrasonic acoustic energy may optionally be used during the stirring.

After stirring, the nanoparticles 140 may be separated from the mixture by, e.g., centrifugation. The nanoparticles 140 may be rinsed one or more times in clean solvent. In a suitable rinsing step, the nanoparticles 140 are rinsed in toluene and centrifuged four times, but are not dried.

After rinsing, the nanoparticles 140 are added to a solution of organic molecules to form a suspension. In one embodiment, the organic molecule is a polymer. In another embodiment the organic molecule is F8T2 210. F8T2 210 is available from American Dye Source Inc., Quebec, Canada. When F8T2 210 is used, tetrahydrofuran (THF) may be used as the solvent. In this embodiment, about 2.0 g of nanoparticles 140 may be added to 1 L of THF to result in a suspension of about 0.2 wt % nanoparticles 140 in THF. In a step 550, about 10 g of solid F8T2 210 may be added to about 1 L of the Aerosil®/THF suspension and mixed to dissolve the F8T2 210, resulting in a concentration of about 1.0 wt % F8T2 in the suspension.

Returning to step 530, in some cases the channel layer 630 is formed on the substrate 610 by dip-coating. Other suitable casting techniques such as spin-coating or drop-casting may also be used. When a suspension prepared as described above is cast by dip-coating, a withdrawal rate of the substrate 610 from the suspension ranging from about 0.2 mm/s to about 5 mm/s may be used to produce a film ranging from about 70 nm to about 20 nm thickness.

In a step 560, the channel layer 630 and dielectric 620 are patterned using conventional means to expose portions of the substrate 610. The source electrode 640, drain electrode 650 and gate electrode 660 are then conventionally formed over the substrate 610. Formation may be performed, e.g., by deposition of gold using a shadow mask.

The composition 130, prepared as described herein, may have a hole mobility of about $1.6 \text{ e}{-}2 \text{ cm}^2 \cdot \text{V}^{-1} \cdot \text{s}^{-1}$. Advantageously, this mobility may represent an increase by roughly a factor of ten over the mobility of holes in devices based on intrinsic F8T2 210 fabricated under otherwise identical conditions. Moreover, the ratio of on-current ($I_{on}$) to off-current ($I_{off}$) of an oFET 600 may be increased by roughly a factor of ten relative to an oFET fabricated using an intrinsic semiconducting organic molecule.

The resulting composition 130 also substantially retains the mechanical properties of the intrinsic polymer. Moreover, the viscosity of the polymer/aerogel/solvent slurry may be greater than that of a polymer/solvent solution with equivalent polymer concentration. Such an increase of viscosity may be desirable when the channel layer 630 is formed using mass-printing, for example.

Another embodiment is an apparatus. The apparatus includes an electronic device having a first and a second electrode in contact with a channel comprising the composition 130 described herein.

Figure 7:
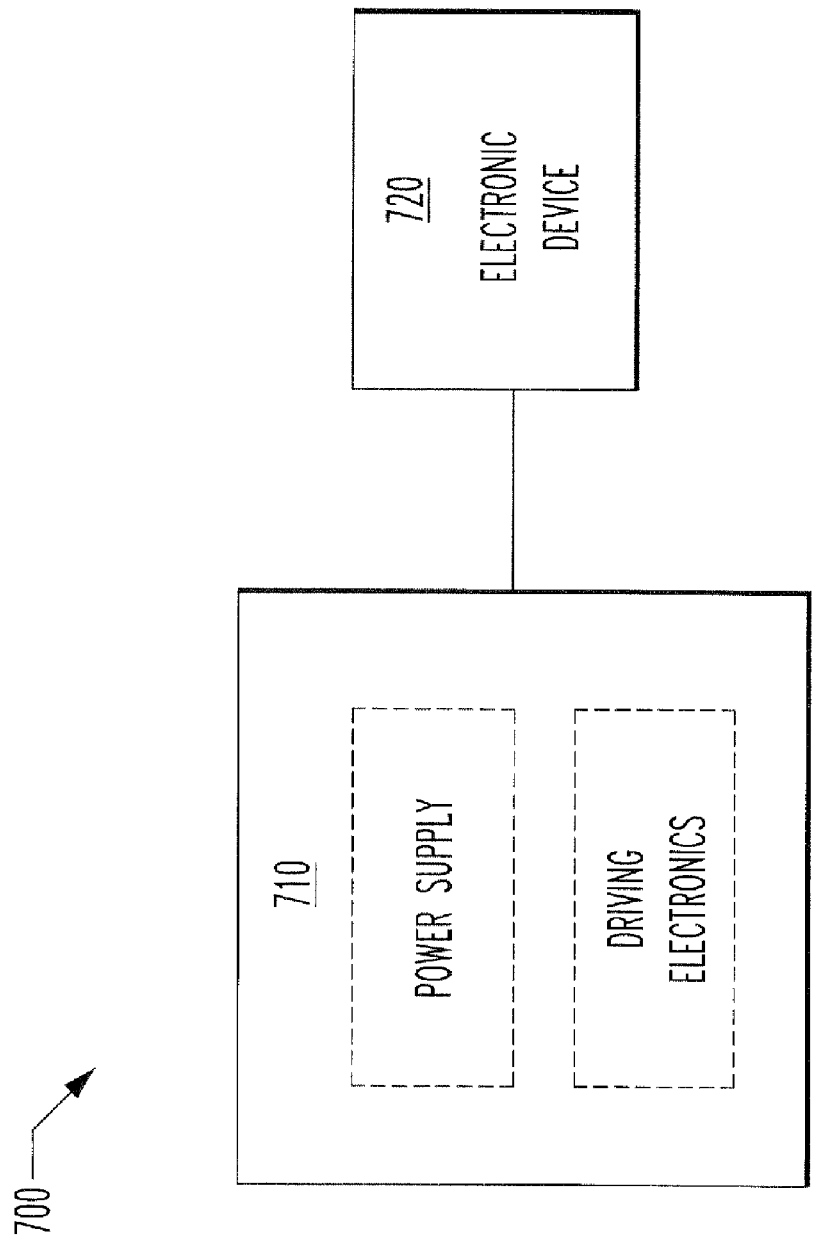
FIG. 7 illustrates an example apparatus.

FIG. 7 shows an example apparatus 700. Electronics 710 may include a power supply and driving electronics to interface to an electronic device 720. The electronic device 720 is formed according to the method 500 described herein, and has a channel comprising the composition 130 described herein. The electronic device 720 may include a gate electrode located to produce an electric field at the surface of the channel. The electronic device 720 may additionally be an oFET fabricated by the aforementioned method.

Although the present invention has been described in detail, those skilled in the pertinent art should understand that they can make various changes, substitutions and alterations herein without departing from the spirit and scope of the invention in its broadest form.

What is claimed is:

1. A composition, comprising:
    a medium of organic molecules; and
    a plurality of nanoparticles dispersed in the medium, each nanoparticle including a coating being chemically bonded to and surrounding a surface thereof, wherein said medium includes a plurality of crystalline regions and amorphous regions between said crystalline regions, each crystalline region of said plurality of crystalline regions includes one of the nanoparticles, and wherein said medium and said plurality of coated nanoparticles dispersed therein form a semiconducting solid.

2. The composition of claim 1, wherein the nanoparticles comprise silicon atoms.

3. The composition of claim 1, wherein the nanoparticles comprise fused silica.

4. The composition of claim 1, wherein the coating comprises a compatibility agent.

5. The composition of claim 4, wherein the compatibility agent comprises an organic moiety.

6. The composition of claim 1, wherein the organic molecules are semiconducting polymer chains.

7. The composition of claim 1, wherein the nanoparticles have an average diameter of about 15 nm or less.

8. The composition of claim 1, wherein said coating comprises a derivative of 4-bromophenyl trimethoxysilane.

9. The composition of claim 8, wherein said organic molecules comprise poly(9,9-dioctylfluorene-alt-bithiophene).

10. The apparatus of claim 1, wherein said coating comprises a derivative of bromophenyl trimethoxysilane.

11. The composition of claim 1, wherein the organic molecules are monodisperse compounds incorporating aromatic or heteroaromatic units.

12. An apparatus, comprising:
    an electronic device having an organic semiconductor channel, and first and second electrodes in contact with the channel, the channel comprising a medium including organic molecules and a plurality of nanoparticles dispersed in the medium, each of the nanoparticles including a coating being chemically bonded to and surrounding a surface thereof,
    wherein said medium includes a plurality of crystalline regions and amorphous regions between said crystalline regions, each crystalline region of said plurality of crystalline regions includes one of the nanoparticles, and wherein said medium and said plurality of coated nanoparticles dispersed therein form a semiconducting solid.

13. The apparatus of claim 12, wherein the device is an FET.

14. The apparatus of claim 12, wherein the nanoparticles comprise silicon atoms.

15. The apparatus of claim 12, wherein the coating comprises a compatibility agent.

16. The apparatus of claim 15, wherein the coating comprises a derivative of bromophenyl trimethoxy silane.

17. The apparatus of claim 12, wherein the organic molecules are semiconducting polymer chains.

18. The apparatus of claim 12, wherein the nanoparticles have an average diameter of about 15 nm or less.

19. The apparatus of claim 12, wherein said coating comprises a derivative of 4-bromophenyl trimethoxysilane.

20. The apparatus of claim 19, wherein said organic molecules comprise poly(9,9-dioctylfluorene-alt-bithiophene).

* * * * *